United States Patent [19]

Haga et al.

[11] Patent Number: 5,060,041

[45] Date of Patent: Oct. 22, 1991

[54] AMORPHOUS SILICON PHOTOSENSOR

[75] Inventors: Koichi Haga; Akishige Murakami, both of Miyagi; Hiroshi Miura, Natori, all of Japan

[73] Assignee: Ricoh Research Institute of General Electronics, Natori, Japan

[21] Appl. No.: 270,633

[22] Filed: Nov. 14, 1988

[30] Foreign Application Priority Data

Nov. 12, 1987 [JP] Japan ................................ 62-286656

[51] Int. Cl.$^5$ ..................... H01L 27/14; H01L 31/00
[52] U.S. Cl. .......................................... 357/30; 357/2; 357/4
[58] Field of Search ............. 357/2, 30 D, 30 J, 30 K, 357/30 P, 17, 61, 4, 4 SL

[56] References Cited

U.S. PATENT DOCUMENTS

| 4,396,793 | 8/1983 | Madan | 357/30 K |
| 4,799,968 | 1/1989 | Watanabe et al. | 357/30 K |
| 4,820,915 | 4/1989 | Hamakawa et al. | 357/2 |
| 4,855,795 | 8/1989 | Yamamoto et al. | 357/2 |
| 4,892,594 | 1/1990 | Fujiwara et al. | 357/30 K |
| 4,907,052 | 3/1990 | Takada et al. | 357/30 J |

FOREIGN PATENT DOCUMENTS

| 0239055 | 11/1980 | Japan | 357/2 |
| 0204843 | 11/1984 | Japan | 357/2 |
| 0066876 | 4/1985 | Japan | 357/2 |
| 0210885 | 10/1985 | Japan | 357/2 |
| 61-222284 | 10/1985 | Japan | 357/17 |
| 0093663 | 5/1986 | Japan | 357/2 |
| 0218177 | 9/1986 | Japan | 357/2 |
| 0292377 | 12/1986 | Japan | 357/2 |
| 0119978 | 6/1987 | Japan | 357/2 |
| 0291980 | 12/1987 | Japan | 357/2 |
| 2202085 | 9/1988 | United Kingdom | 357/2 |

OTHER PUBLICATIONS

"Design Parameters . . . Cells", Okamoto et al., Applied Physics, vol. 19 (1980), pp. 545-550.

Primary Examiner—Rolf Hille
Assistant Examiner—Minh Loan Tran
Attorney, Agent, or Firm—Oblon, Spivak, McClelland, Maier & Neustadt

[57] ABSTRACT

An amorphous silicon photosensor comprising a substrate, a lower electrode formed on the substrate, an amorphous silicon photoelectric conversion layer formed on the lower electrode, and an upper electrode formed on the amorphous silicon photoelectric conversion layer, wherein the substrate is transparent to the incident light for photosensing, the lower electrode and the upper electrode comprises at least one of an electroconductive oxide or an electroconductive nitride, both of the electrodes for receiving the incident light for photosensing being transparent to the incident light, and the amorphous silicon photoelectric conversion layer comprises a plurality of amorphous silicon layers, and at least one of the amorphous silicon layers in contact with the electroconductive oxide or the electroconductive nitride comprises at least one of the same atoms as the constituent atoms of the electroconductive oxide or the electroconductive nitride.

33 Claims, 6 Drawing Sheets

CONSTANT ADDITION

DECREASING ADDITION

DECREASING ADDITION

DECREASING ADDITION

TWO-STEPWISE ADDITION

THREE-STEPWISE ADDITION

LIGHT INCIDENCE FROM UPPER ELECTRODE

LIGHT INCIDENCE FROM LOWER ELECTRODE

AMORPHOUS SILICON PHOTOSENSOR

BACKGROUND OF THE INVENTION

The present invention relates to an amorphous silicon photosensor.

It is required that an image sensor using amorphous silicon be as simply structured as possible by forming the elements of the sensor in the form of a thin film and making them integral in order to obtain an image sensor with a low price, but capable of attaining high image resolution and high S/N ratio.

Conventionally there are three types of amorphous silicon photosensors as shown in FIGS. 1A, 1B and 1C.

Japanese Laid-Open Patent Application 46-26478 discloses an MIS type semi-conductor photoelectric conversion device or photosensor in which an insulating layer thereof is made of a nitride. More specifically, FIG. 1A shows a schematic cross-sectional view of such an MIS type amorphous silicon photosensor. This photosensor is structured in such a configuration that a lower electrode 102, an intrinsic amorphous silicon layer 103, an insulating layer 104, and an upper transparent electrode 105 are successively overlaid on a substrate 101. In this MIS type photosensor, the insulating layer 104 interposed between the intrinsic amorphous silicon layer 103 and the upper transparent electrode 105 comprises an insulating material such as $SiO_2$ or a nitride, whereby a rectifying function is provided. The insulating layer 104 must be as thin as 100 Å or less. However, in practice, it is extremely difficult to make such a thin insulating layer with a uniform thickness.

Japanese Laid-Open Patent Application 57-106179 discloses a photoelectric conversion device having a Schottky barrier contact with a metal layer and a semi-conductor layer. More specifically, FIG. 1B shows a schematic cross-sectional view of such a Schottky barrier type amorphous silicon photosensor. This photosensor is structured in such a configuration that a lower electrode 112, an intrinsic amorphous silicon layer 113 and a Schottky barrier semi-transparent metal layer 114 are successively overlaid on a substrate 111. In this photosensor, the height of the Schottky barrier produced by the contact of the semi-transparent metal layer 114 with the intrinsic amorphous silicon layer 113 is changed by changing the magnitude of a bias voltage applied thereto. By utilizing this property, this photosensor is provided with a rectifying function. However, in this photosensor, it is considered that a thin oxide layer is usually present between the amorphous silicon layer 113 and the metal layer 114, and the dangling bonds of the amorphous silicon layer 113 are also present at the interface of the two layers 113 and 114, so that it is difficult to control the Schottky barrier at the interface of the two layers.

Japanese Laid-Open Patent Application 56-142680 discloses a PIN type photoelectric conversion device. FIG. 1C shows a schematic cross-sectional view of such a PIN type amorphous silicon photosensor. This photosensor is structured in such a configuration that a lower electrode 122, an n-type layer 123, and an intrinsic amorphous silicon layer 124, a p-type layer 125 and an upper transparent electrode 126 are successively overlaid on a substrate 121. The PIN type photoelectric conversion device can be made thinner than the other conventional photoelectric conversion devices. However, since the electric conductivity of the n-type layer and p-type layers is as large as $10^{-3}(S-cm^{-1})$ or more, when they are incorporated in the PIN type photoelectric conversion device, the total sheet resistance thereof is too large to ignore. The result is that each device must be spearately structured when incorporating them in an image photosensor and accordingly its manufacturing is difficult. Furthermore, in this photoelectric conversion device, since p- and n-control is performed by impurity-doping, it is not easy to make the thermal stability of the conversion device sufficiently reliable for use in practice.

SUMMARY OF THE INVENTION

It is therefore an object of the present invention to provide a thin amorphous silicon photosensor from which the shortcomings of the conventional photosensors are eliminated, capable of attaining high S/N ratio and allowing light to enter from both opposite sides thereof.

This object of the present invention can be attained by an amorphous silicon photosensor comprising a substrate on which a lower electrode, an amorphous silicon photoelectric conversion layer comprising a plurality of amorphous silicon layers, and an upper electrode are successively overlaid, with the key features that (i) the lower and upper electrodes comprises at least one of an electroconductive oxide or an electroconductive nitride, (ii) at least one of the amorphous silicon layers of the photoelectric conversion layer, which is in contact with the electroconductive oxice or the electroconductive nitride, comprises at least one of the same atoms as the constituent atoms of the electroconductive oxide or the electroconductive nitride, and (iii) any of the electrodes which receives incident light is highly transparent to the incident light.

DETAILED DESCRIPTION OF THE PREFERRED EMBODIMENTS

In a preferable example of an amorphous silicon photosensor according to the present invention, the photoelectric conversion layer thereof comprises a plurality of layers, with at least one layer thereof being made of a hydrogenated amorphous silicon alloy which contains at least one of an oxygen atom or a nitrogen atom.

In another preferable example of an amorphous silicon photosensor according to the present invention, at least one of the amorphous silicon layers of the photoelectric conversion layer in contact with the electroconductive oxide or the electroconductive nitride of any of the electrodes contains at least one of the same atoms as the constituent atoms of the electroconductive oxide or nitride.

In a further preferable example of an amorphous silicon photosensor according to the present invention, at least one of the amorphous silicon layers of the photoelectric conversion layer in contact with the electroconductive oxide or the elctroconductive nitride contains as an additional atom at least one of the atoms of the third or fifth group of the periodic table.

Figure 1A:
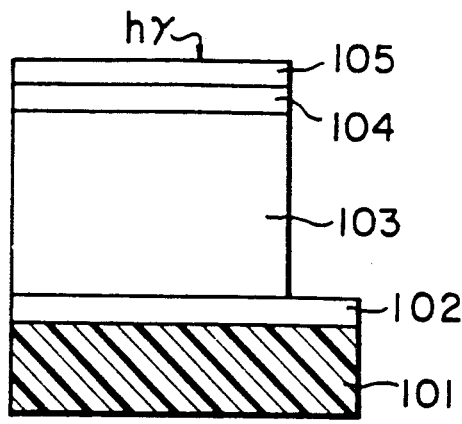
FIGS. 1A through 1C are schematic cross-sectional views of conventional photoelectric conversion devices.
Figure 1B:
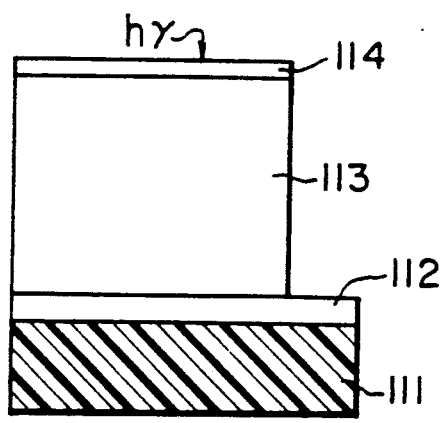
Figure 1C:
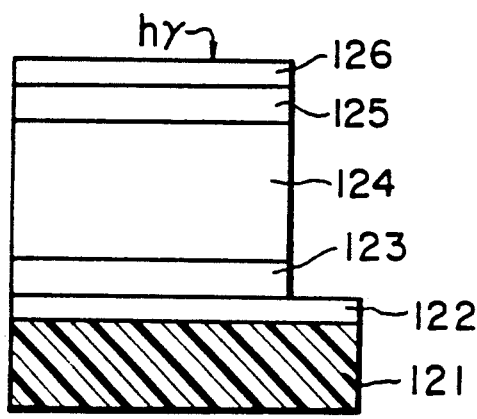
Figure 2:
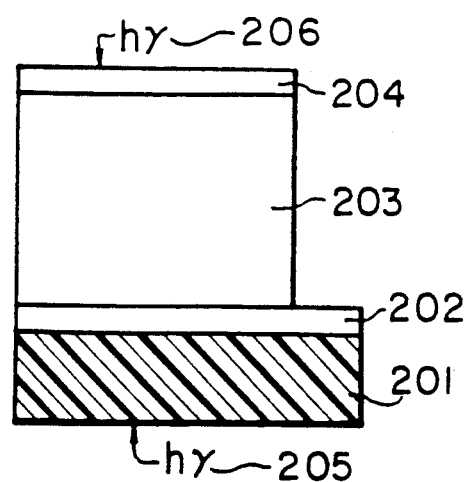
FIGS. 2 and 3 are the general schematic cross-sectional views of amorphous silicon photosensors according to the present invention.

FIG. 2 is a schematic cross secitonal view of an amorphous silicon photosensor according to the present invention for the general explanation thereof, which comprises a substrate 201 on which a lower electrode 202, a photoelectric conversion layer 203, and an upper electrode 204 are successively overlaid. In this photosensor, the substrate 201 is made of a transparent material or made of a material which is particularly highly transparent to the light employed for photosensing.

As the material for the lower electrode 202 and the upper electrode 204, an electroconductive oxide or an electroconductive nitride is employed and these two electrodes are made so as to be highly transparent to the light employed for photosensing. By constructing the lower and upper electrodes 202 and 204 in this manner, two incident-light-entering directions 205 and 206, which are respectively from the lower electrode side and from the upper electrode side, can be selectively or simultaneously used for entering light to the photoelectric conversion layer 203 as shown in FIG. 2, so that this photosensor can find many applications in a variety of fields.

The photoelectric conversion layer 203 mainly comprises an amorphous silicon alloy layer which contains at least one atom of hydrogen, a halogen or heavy hydrogen. When no additive atom is contained in the amorphous silicon alloy layer, the amorphous silicon alloy layer is of an (n−) type, while when a small amount of a third (III) group atom is added to the amorphous silicon alloy layer, the amorphous silicon alloy layer is of an intrinsic type (hereinafter referred to as the i-type) or a (p−)type. In the present invention, the amorphous silicon ally layer may be of an (n−) type, an i-type or a (p−) type.

In the present invention, when the photoelectric conversion layer 203 comprises as the main layer a hydrogen-containing amorphous silicon alloy layer (a-Si:H), the photoelectric conversion layer 203 may be (i) a double layer consisting of the a-Si:H layer and one layer of an oxygen-containing hydrogenated amorphous silicon alloy layer (a-Si:O:H) or a nitrogen-containing hydrogenated amorphous silicon alloy layer (a-Si:N:H), (ii) a triple layer consisitng of the hydrogen-containing amorphous silicon alloy layer (a-Si:H) which is sandwiched between the a-Si:O:H layer and the a-Si:N:H layers or between the a-Si:O:H layer and the a-Si:N:H layer, or (iii) a multiple layer comprising the hydrogen-containing amorphous silicon alloy layer (a-Si:H) in combination with any of the above-mentioned layers and other usable layers.

In the above-mentioned photoelectric conversion layer 203, the layer which is in contact with an electroconductive oxide or an electroconductive nitride used as a material for the electrodes contains any of the atoms of which the electroconductive oxide or nitride is comprised. For example, in the case where an ITO layer is in contact with an a-Si:O:H layer, any of the atoms contained in ITO such as In, Sn and O is contained in the a-Si:O:H layer.

In the photoelectric conversion layer in the present invention, taking as an example the case where the a-Si:O:H layer contains a third (III) group atom or a fifth group (IV) atom, the photoelectric conversion layer is of a p-type or an n-type. Therefore, the photoelectric conversion layer may be (i) a triple layer consisting of a (p+) a-Si:O:H layer, an a-Si:H layer and an a-Si:O:H layer, (ii) a triple layer consisting of an a-Si:O:H layer, an a-Si:H layer and an (n+) a-Si:O:H layer, and (iii) a triple layer consisting of a (p+) a-Si:O:H layer, an a-Si:H layer and an (n+) a-Si:O:H layer. Thus, when the photoelectric conversion layer is of a three-layer type, in which the a-Si:H layer is sandwiched between the a-SiO:H layers, the magnitude of the electric field applied to the a-Si:H layer is so small that the entire thickness of the photosensor using this photoelectric conversion layer can be decreased. Furthermore, since the a-Si:O:H layer works as a barrier against the injection of electrons and positive holes, the injection of such carriers can be inhibited. As a result, a thin photosensor with sufficient sensitivity (i.e., having high Iph/Id ratio) for use in practice can be obtained when the above photoelectric conversion layer is employed.

Furthermore, when in the above-mentioned structure, the a-Si:O:H layer which is in contact with the electroconductive oxide serving as the material of the electrodes contains at least one of the same atoms of the electroconductive oxide, such as hydrogen, whereby the chemical reaction between the electrode and the photoelectric conversion layer, which would otherwise readily occur, can be minimized, and a thermally stable photosensor can be obtained.

When a third (III) group atom or a fifth (V) group atom is added to the a-Si:O:H layer of the above photoelectric conversion layer so that the photoelectric conversion layer is of a p-type layer or an n-type layer, the specific resistance of the p-type layer or n-type layer can be changed by changing the oxygen content in the a-Si:O:H layer. Thus, the specific resistance of the p-type layer or n-type layer can be changed in such a manner that the specific resistance of the (p+) a-Si:O:H layer or (n+) a-Si:O:H layer is almost the same as that of the a-Si:H layer (that is, $\rho = 10^7 \sim 10^{12}$ Ωcm). Therefore, in sharp contrast to the manufacturing process of the conventional PIN structure photosensor, the sheet resistance of each photoelectric conversion device can be made negligibly small, so that a plurality of the photoelectric conversion devices can be integrally formed into one integral device and accordingly the manufacturing process of the integral device is simple and the formation of pin holes in the device can be minimized or completely avoided.

Figure 3:
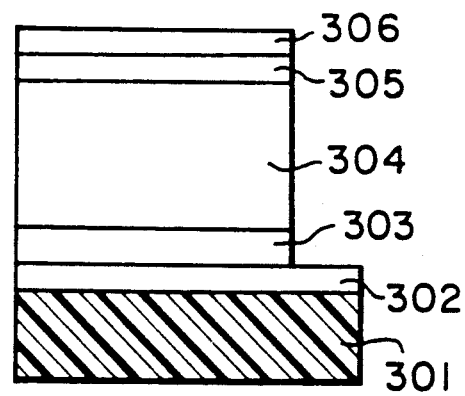
Figure 4A:
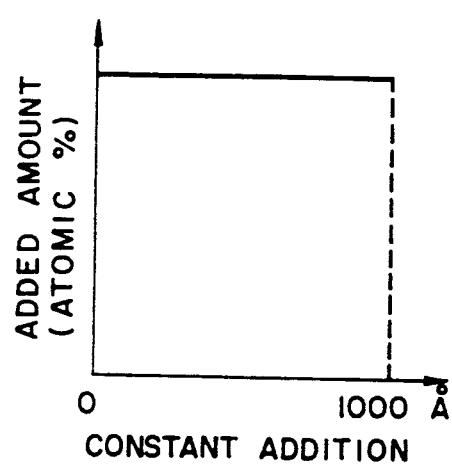
FIGS. 4A through 4F show diagrams in explanation of various gas-phase addition modes of adding a third (III) or fifth (V) group atom to an amorphous silicon layer.
Figure 4B:
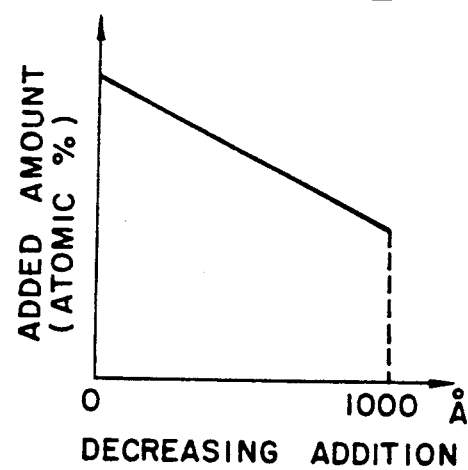
Figure 4C:
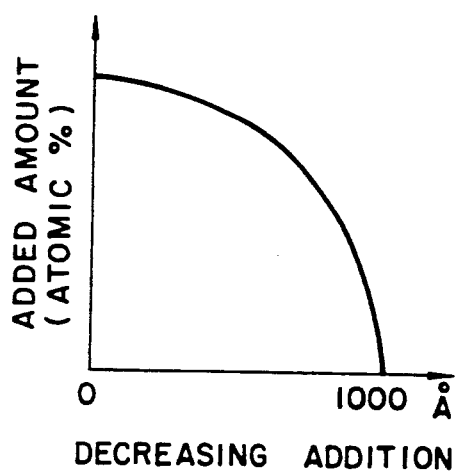
Figure 4D:
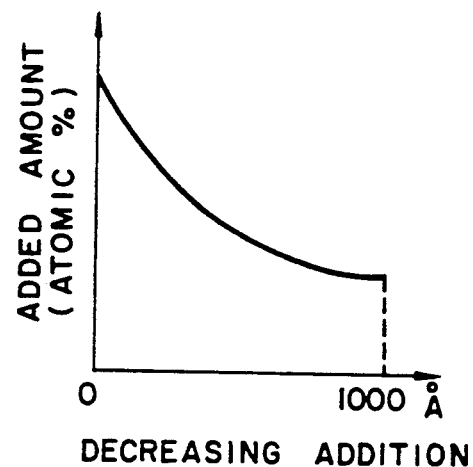
Figure 4E:
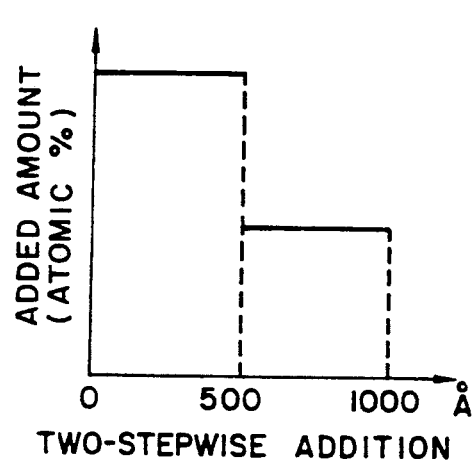
Figure 4F:
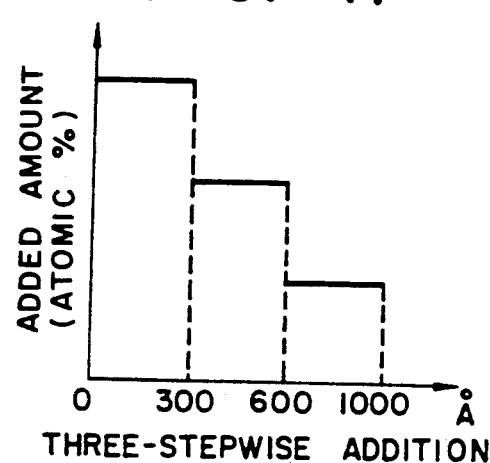

FIG. 3 shows a schematic cross sectional view of an example of an amorphous silicon photosensor including a three-layer type photoelectric conversion layer according to the present invention.

In this amorphous silicon photosensor, a lower electrode 302 comprising an electroconductive oxide or nitride is overlaid on a substrate 301. On the lower electrode 302, a first amorphous silicon alloy layer 303 which is an a-Si:O:H layer or an a-Si:O:H layer which contains a third (III) group atom or a fifth (V) group atom, a second amorphous silicon layer 304 which is an a-Si:H layer, and a third amorphous silicon layer 305 which is an a-Si:O:H layer or an a-Si:O:H layer which contains a third (III) group atom or a fifth (V) group atom are successively overlaid, whereby a photoelectric conversion layer is formed on the lower electrode 302. Finally an upper electrode 306 comprising an electroconductive oxide or nitride is overlaid on the third amorphous silicon alloy layer 305, whereby the amorphous silicon photosensor according to the present invention is prepared. In this photosensor, it is preferable that the elecroconductive oxide or nitride of the lower electrode 302 and the upper electrode 306 have a light transmittance of 70% or more with respect to the light employed for photosensing. The amorphous silicon layers which are in contact with the above-mentioned electroconductive oxide or nitride contain at least one of the same atoms as the constituent atoms of the electroconductive oxide or nitride. For example, when an a-Si:O:H layer is formed on an electrode layer of ITO which is an electroconductive oxide, for example, In, which is one of the constituent atoms of ITO, is dispersed into the a-Si:O:H layer with a depth of about 100 Å ~ 500 Å to form a thin In-dispersed p-type surface layer in the a-Si:O:H layer. This can be carried out by controlling the conditions for depositing the a-Si:O:H layer on the ITO layer. Due to the presence of such a thin p-type surface layer in the a-Si:O:H layer, when a negative electric field is applied to the ITO electrode layer, the pairs of photo carriers generated in the a-Si:O:H layer or in the a-Si:H layer are transported into the ITO layer without being trapped at the interface between the ITO layer and the a-Si:O:H layer. Furthermore, since the p-type layer is so thin that the photosensitivity of the a-Si:O:H layer is scarcely decreased.

As the substrate 301, a transparent substrate and a transparent substrate coated with a film having a high selective transmittance to the light employed for photosensing can be employed. Such a transparent substrate can be made of an inorganic transparent material such as glass, and an organic transparent material such as polyethylene and polypropylene.

The lower electrode 302 and the upper electrode 306 can be made of an electroconductive oxide such as ITO, $TiO_2$, $In_2O_3$, $SnO_2$, and $CrO_2$, preferably ITO and $In_2O_3$, and an electroconductive nitride such as InN, SnN, TiN, and BN, preferably InN and BN. These electroconductive oxides and nitrides can be deposited on the substrate 301, for example, by sputtering method, vacuum deposition method, P-CVD method, thermal CVD method, and MOCVD method.

The second amorphous silicon layer 304 of the photoelectric conversion layer can be prepared by P-CVD method, by using as reaction gases a hydrogen silcide such as $SiH_4$ and $Si_2H_6$, a silicon halide such as $SiF_4$, $Si_2F_6$ and $SiCl_4$, and a heavy hydrogen silicide such a $SiD_4$. In the preparation of the second amorphous silicon layer 304, a $H_2$ gas may be employed as a dilution gas.

When no additives are added to the amorphous silicon (a-Si:H) layer, the layer is of an (n-) type. Therefore, the amorphous silicon layer of this type is not suitable for use in an electric field application method in which positive holes are mainly used for photo-carrier conduction. Therefore, the amorphous silicon layer may be converted either to an i-type or to a p-type for increasing the mobility of the positive holes in the a-Si:H layer, by addition of a third (III) group atom thereto by a diffusion addition method using an electroconductive oxide or nitride, or a gas-phase addition method using the starting material gases and an addition gas. As the third (III) group atoms for use in the gas phase addition method, for example, B can be employed. In case, for instance, a $B_2H_6$ gas is employed as the addition gas, with the addition amount of B in the amorphous silicon layer being in the range of 0.1 to 5000 ppm, preferably in the range of about 1 to about 1000 ppm.

As the first and third amorphous silicon layers 303 and 305, for example, an a-Si:O:H layer and an a-Si:N:H layer can employed. The a-Si:O:H layer can be prepared by the P-CVD method by the addition of a gas such as $O_2$, CO, $CO_2$, and $N_2O$ to a hydrogen silicide gas such as $SiH_4$ and $Si_2H_6$. The a-Si:N:H layer can be prepared by the P-CVD method by the addition of a gas such as $NH_3$, $N_2H_6$, and $N_2O$ to a hydrogen silicide gas such as $SiH_4$ and $Si_2H_6$. When preparing the a-Si:O:H layer and a-Si:N:H, a $H_2$ gas may be employed as a dilution gas.

It is preferable that the addition amount of oxygen atom to the a-Si:O:H layer be in the range of 0.5 to 60 atomic %, and the addition amount of nitrogen atom to the a-Si:N:H be in the range of 0.1 to 40 atomic %.

When a third (III) group atom or a fifth (V) group atom is added to each of the above layers, the addition is performed at least either by the gas-phase addition method using addition gases or by the diffusion addition method using the electroconductive oxides or nitrides.

When any of the above amorphous silicon layers is converted to a (p+) type by the gas-phase addition using a third (III) group atom, for example, a $B_2H_6$ gas is employed as an addition gas, while when the amorphous silicon layer is converted to an (n+) type, for instance, a $PH_3$ gas is employed as an addition gas. In the gas-phase addition method, there are different addition modes (a) through (f) as illustrated in FIG. 4. These modes are selectively employed, depending upon the desired light-current and spectrum sensitivity as shown in Table 1, which shows the relationship between the addition mode of third (III) group atom and the photoelectric characteristics of the amorphous silicon layer.

TABLE 1

Relationship between Addition Mode of III Group Atom and Photoelectric Characteristics of Amorphous Silicon Layer

| Addition Mode | Light-current (A) | Spectrum Sensitivity | | Photo-response (msec) |
| --- | --- | --- | --- | --- |
| | | Short Wavelength (450 nm) | Long Wavelength (650 nm) | |
| (a) | $2 \sim 5 \times 10^{-7}$ | less than 0.5 | 0.5~0.8 | 0.05~0.1 |
| (b) | $5 \times 10^{-8} \sim 2 \times 10^{-7}$ | 0.5~0.8 | 0.5~0.8 | 0.1~1.5 |
| (c) | $5 \times 10^{-8} \sim$ | 0.5~0.8 | less than | 0.05~0.1 |

TABLE 1-continued

Relationship between Addition Mode of III Group Atom and Photoelectric Characteristics of Amorphous Silicon Layer

| | | Spectrum Sensitivity | | |
|---|---|---|---|---|
| Addition Mode | Light-current (A) | Short Wavelength (450 nm) | Long Wavelength (650 nm) | Photo-response (msec) |
| (d) | $2 \times 10^{-7}$ $5 \times 10^{-8} \sim$ $2 \times 10^{-7}$ | 0.8~1.0 | 0.5 0.8~1.0 | 0.1~1.0 |
| (e) | less than $2 \times 10^{-7}$ | less than 0.5 | 0.5~0.8 | more than 1.5 |
| (f) | $5 \times 10^{-8} \sim$ $2 \times 10^{-7}$ | 0.8~1.0 | 0.5~0.8 | more than 1.5 |

The addition amount (atomic %) in each amorphous silicon layer is roughly classified into (i) a constant addition, (ii) a decreasing addition, and (iii) a stepwise addition, in the depth direction of the layer. FIG. 4 shows the case where the thickness of the amorphous silicon layer is 1,000 Å, and in each graph, the ordinate indicates the added amount (atomic %) in the amorphous silicon layer, and the abscissa indicates the depth of the layer. The added amount of the third (III) group atom and the fifth (V) group atom may be varied from $10^{-4}$ to 5 atomic % in each amorphous silicon layer.

In the diffusion addition, the decreasing addition is carried out and the added atom is diffused into the amorphous silicon layer from the surface layer of the electroconductive oxide or nitride layer. The added amount of the atom in the surface layer is in the range of 0.001 to 5 atomic %, and the added atom can be diffused into the amorphous silicon layer in the portion with a depth of 500Å to 2,500Å. As shown in Table 1, the spectrum photosensitivity of the amorphous silicon layer is significantly improved by this diffusion addition.

In the amorphous photosensor as shown in FIG. 3, it is preferable that the lower electrode 302 have a thickness of about 500Å to about 2,000Å, the first amorphous silicon layer 303 have a thickness of about 100Å to about 1,000Å, the second amorphous silicon layer 304 have a thickness of about 0.5 μm to about 2.5 μm, the third amorphous silicon layer 305 have a thickness of about 100Å to about 1,000Å, and the upper electrode 306 have a thickness of about 500Å to about 2,000Å.

The present invention will now be explained in more detail with reference to the following examples. These examples are given for the purpose of the illustration of the present invention, but are not intended to be limiting thereof.

EXAMPLE 1

Figure 5:
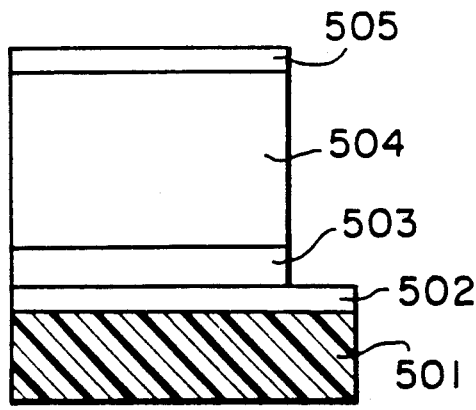
FIGS. 5 to 16 are schematic cross-sectional views of specific examples of amorphous silicon photosensors in Examples 1 to 12 according to the present invention.

FIG. 5 shows a schematic cross sectional view of an amorphous silicon photosensor No. 1 according to the present invention, which was prepared as follows.

An ITO layer 502 was formed with a thickness of 750Å on a Pyrex glass substrate 501 by the RF sputtering method. An a-Si:O:H layer 503 serving as a first amorphous silicon layer and an a-Si:H layer 504 serving as a second amorphous silicon layer were successively formed on the ITO layer 502 under the following layer formation conditions:

| [a-Si:O:H layer 503] | |
|---|---|
| Gas flow rate ratio: | $SiH_4/H_2 = 0.2$ |
| | $CO_2/SiH_4 = 4$ |
| Substrate temperature: | 250° C. |
| Vacuum degree: | 1.0 Torr |
| RF power: | 8 W |
| Thickness: | 500Å |
| [a-Si:H layer 504] | |
| Gas flow rate ratio: | $SiH_4/H_2 = 0.2$ |
| Substrate temperature: | 250° C. |
| Vacuum degree: | 1.0 Torr |
| RF power: | 8 W |
| Thickness: | 8000Å |

Finally, an ITO layer 505 was formed with a thickness of 750Å on the a-Si:H layer 504 by the RF sputtering method, whereby the amorphous silicon photosensor No. 1 according to the present invention was prepared.

EXAMPLE 2

Figure 6:
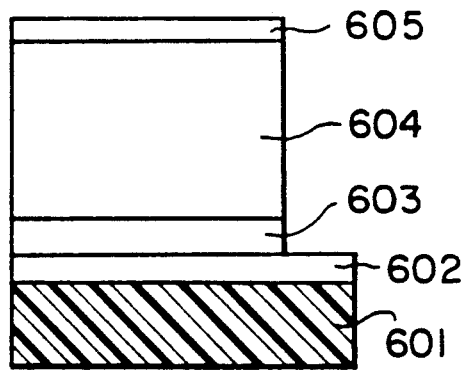

FIG. 6 shows a schematic cross sectional view of an amorphous silicon photosensor No. 2 according to the present invention, which was prepared as follows.

An ITO layer 602 was formed with a thickness of 1,000Å on an ordinary glass substrate 601 by the RF sputtering method. A (p+) a-Si:O:F:H layer 603, and an a-Si-:F:H layer 604 were successively formed on the ITO layer 602 under the following layer formation conditions:

| [(p+) a-Si:O:F:H layer 603] | |
|---|---|
| III group dopant: | $B_2H_6/H_2$ 2,000 ppm |
| Gas flow rate ratio: | $SiH_4/H_2 = 0.2$ |
| | $CO_2/SiF_4 = 8$ |
| | $B_2H_6/SiF_4 = 1 \times 10^{-3}$ |
| Substrate temperature: | 250° C. |
| Vacuum degree: | 1.0 Torr |
| RF power: | 8 W |
| Thickness: | 800Å |
| [a-Si:F:H layer 604] | |
| Gas flow rate ratio: | $SiF_4/H_2 = 0.1$ |
| Substrate temperature: | 250° C. |
| Vacuum degree: | 1.0 Torr |
| RF power: | 20 W |
| Thickness: | 7000Å |

Finally, a $SnO_2$ layer 605 was formed with a thickness of 750Å on the a-Si:F:H layer 604 by the vacuum deposition method, whereby the amorphous silicon photosensor No. 2 according to the present invention was prepared.

EXAMPLE 3

Figure 7:
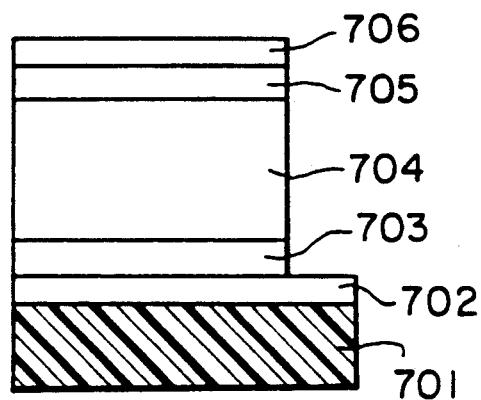

FIG. 7 shows a schematic cross sectional view of an amorphous silicon photosensor No. 3 according to the present invention, which was prepared as follows.

An ITO layer 702 was formed with a thickness of 750Å on a Pyrex glass substrate 701 by the RF sputtering method. An a-Si:O:H layer 703, a (p−) a-Si:H layer 704 and an a-Si:O:H 705 were successively formed on the ITO layer 702 under the following layer formation conditions:

| [a-Si:O:H layer 703] | |
|---|---|
| Gas flow rate ratio: | $SiH_4/H_2 = 0.2$ |
| | $CO_2/SiH_4 = 4$ |
| Substrate temperature: | 250° C. |
| Vacuum degree: | 1.0 Torr |
| RF power: | 8 W |
| Thickness: | 500Å |
| [(p−) a-Si:H layer 704] | |
| III group dopant: | $B_2H_6/H_2$ 1.0 ppm |

-continued

| | |
|---|---|
| Gas flow rate ratio: | $SiH_4/H_2 = 0.2$ |
| | $B_2H_6/SiH_4 = 1 \times 10^{-7}$ |
| Substrate temperature: | 250° C. |
| Vacuum degree: | 1.0 Torr |
| RF power: | 20 W |
| Thickness: | 8000Å |
| [a-Si:O:H layer 705] | |
| Gas flow rate ratio: | $SiH_4/H_2 = 0.2$ |
| | $CO_2/SiH_4 = 25$ |
| Substrate temperature: | 250° C. |
| Vacuum degree: | 1.0 Torr |
| RF power: | 8 W |
| Thickness: | 200Å |

Finally, an ITO layer 706 was formed with a thickness of 750Å on the a-Si:H layer 705 by the RF sputtering method, whereby the amorphous silicon photosensor No. 3 according to the present invention was prepared.

EXAMPLE 4

Figure 8:
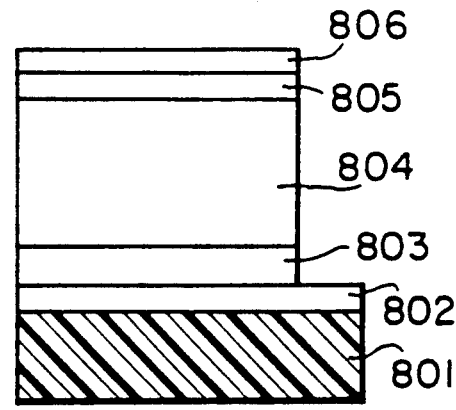

FIG. 8 shows a schematic cross sectional view of an amorphous silicon photosensor No. 4 according to the present invention, which was prepared as follows.

An $In_2O_3$ layer 802 was formed with a thickness of 750Å on a quarz glass substrate 801 by the RG sputtering method. An (p+) a-Si:O:H layer 803, an a-Si:H layer 804, and an a-Si:O:H layer 805 were successively formed on the $In_2O_3$ layer 802 by the P-CVD method under the folowing layer formation conditions:

| | |
|---|---|
| [(p+) a-Si:O:H layer 803] | |
| III group dopant: | $B_2H_6/H_2$ 2000 ppm |
| Gas flow rate ratio: | $SiH_4/H_2 = 0.1$ |
| | $CO_2/SiH_4 = 8$ |
| | $B_2H_6/SiH_4 = 2 \times 10^{-3}$ |
| Substrate temperature: | 250° C. |
| Vacuum degree: | 1.0 Torr |
| RF power: | 8 W |
| Thickness: | 500Å |
| [a-Si:H layer 804] | |
| Gas flow rate ratio: | $SiH_4/H_2 = 0.2$ |
| Substrate temperature: | 250° C. |
| Vacuum degree: | 1.0 Torr |
| RF power: | 20 W |
| Thickness: | 8000Å |
| [a-Si:O:H layer 805] | |
| Gas flow rate ratio: | $SiH_4/H_2 = 0.2$ |
| | $CO_2/SiH_4 = 25$ |
| Substrate temperature: | 250° C. |
| Vacuum degree: | 1.0 Torr |
| RF power: | 8 W |
| Thickness: | 200Å |

Finally, an ITO layer 806 was formed with thickness of 750Å on the a-Si-O:H layer 805 by the RF sputtering method, whereby the amorphous silicon photosensor No. 4 according to the present invention was prepared.

EXAMPLE 5

Figure 9:
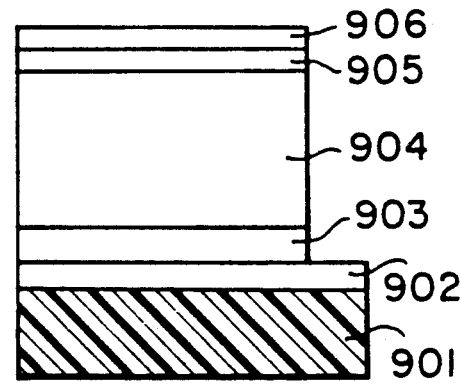

FIG. 9 shows a schematic cross sectional view of an amorphous silicon photosensor No. 5 according to the present invention, which was prepared as follows.

An $In_2O_3$ layer 902 was formed with a thickness of 1,000Å on a Pyrex glass substrate 901 by the RF sputtering method. An a-Si:O:H layer 903, an a-Si:H layer 904, and an (n+) a-Si:O:H layer 905 were successively formed on the $In_2O_3$ layer 802 by the P-CVD method under the following layer formation conditions:

| | |
|---|---|
| [a-Si:O:H layer 903] | |
| Gas flow rate ratio: | $SiH_4/H_2 = 0.2$ |
| | $CO_2/SiH_4 = 10$ |
| Substrate temperature: | 250° C. |
| Vacuum degree: | 1.0 Torr |
| RF power: | 8 W |
| Thickness: | 700Å |
| [a-Si:H layer 904] | |
| Gas flow rate ratio: | $SiH_4/H_2 = 0.2$ |
| Substrate temperature: | 250° C. |
| Vacuum degree: | 1.0 Torr |
| RF power: | 20 W |
| Thickness: | 6500Å |
| [(n+) a-Si:N:H layer 905] | |
| III group dopant: | $PH_3/H_2$ 2000 ppm |
| Gas flow rate ratio: | $SiH_4/H_2 = 0.1$ |
| | $CO_2/SiH_4 = 8$ |
| | $PH_3/SiH_4 = 8 \times 10^{-3}$ |
| Substrate temperature: | 250° C. |
| Vacuum degree: | 1.0 Torr |
| RF power: | 8 W |
| Thickness: | 200Å |

Finally a $TiO_2$ layer 906 was formed with a thickness of 500Å on the (n+) a-Si:N:H layer 905 by the vacuum deposition method with introduction of oxygen, whereby the amorphous silicon photosensor No. 5 according to the present invention was prepared.

EXAMPLE 6

Figure 10:
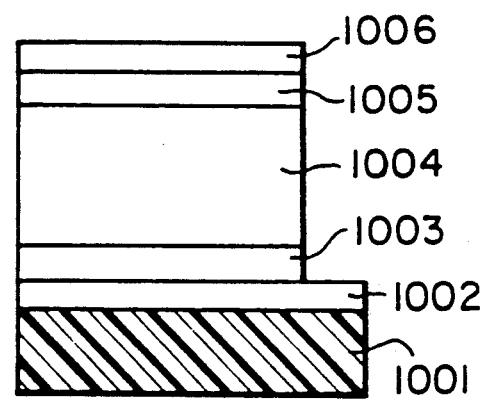

FIG. 10 shows a schematic cross sectional view of an amorphous silicon photosensor No. 6 according to the present invention, which was prepared as follows.

A TiN layer 1002 was formed with a thickness of 1,000Å on an ordinary glass substrate 1001 by the ARE method. A (p+) a-Si:O:F:H layer 1003, an a-Si:H layer 1004, and an (n+) a-Si:O:F:H layer 1005 were successively formed on the TiN layer 1002 by the P-CVD method under the following layer formation conditions:

| | |
|---|---|
| [(p+) a-Si:O:F:H layer 1003] | |
| III group dopant: | $B_2H_6/H_2$ 2000 ppm |
| Gas flow rate ratio: | $SiH_4/H_2 = 0.2$ |
| | $CO_2/SiF_4 = 6$ |
| | $B_2H_6/SiF_4 = 1 \times 10^{-2}$ |
| Substrate temperature: | 250° C. |
| Vacuum degree: | 1.0 Torr |
| RF power: | 8 W |
| Thickness: | 500Å |
| [a-Si:H layer 1004] | |
| Gas flow rate ratio: | $SiH_4/H_2 = 0.2$ |
| Substrate temperature: | 250° C. |
| Vacuum degree: | 1.0 Torr |
| RF power: | 20 W |
| Thickness: | 5000Å |
| [(n+) a-Si:O:F:H layer 1005] | |
| V group dopant: | $PH_3/H_2$ 2000 ppm |
| Gas flow rate ratio: | $SiF_4/H_2 = 0.2$ |
| | $CO_2/SiF_4 = 8$ |
| | $PH_3/SiF_4 = 1.5 \times 10^{-2}$ |
| Substrate temperature: | 250° C. |
| Vacuum degree: | 1.0 Torr |
| RF power: | 8 W |
| Thickness: | 200Å |

Finally, an ITO layer 1006 was formed with a thickness of 750Å on the (n+) a-Si:O:F:H layer 1005 by the RF sputtering method, whereby the amorphous silicon photosensor No. 6 according to the present invention was prepared.

EXAMPLE 7

Figure 11:
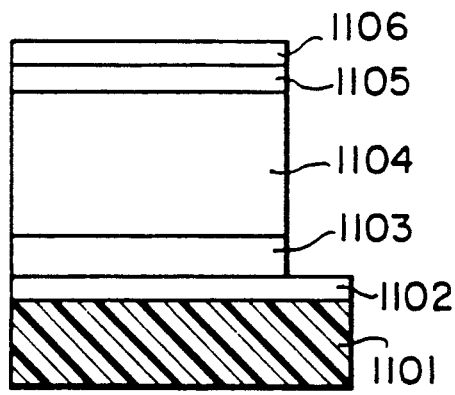

FIG. 11 shows a schematic cross sectional view of an amorphous silicon photosensor No. 7 according to the present invention, which was prepared as follows.

A SnO$_2$(Sb) layer 1102 as formed with a thickness of 750Å on a polyimide film substrate 1101 by the RF sputtering method. An (n+) a-Si:O:H layer 1103, an s-Si:H layer 1104, and a (p+) a-Si:O:H layer 1105 were successively formed on the SnO$_2$(Sb) layer 1002 by the P-CVD method under the following layer formation conditions:

| [(n+) a-Si:O:H layer 1103] | |
| --- | --- |
| V group dopant: | PH$_3$/H$_2$ 2000 ppm |
| Gas flow rate ratio: | SiH$_4$H$_2$ = 0.2 |
| | CO$_2$/SiH$_4$ = 4 |
| | PH$_3$/SiH$_4$ = 1.5 × 10$^{-2}$ |
| Substrate temperature: | 250° C. |
| Vacuum degree: | 1.0 Torr |
| RF power: | 4 W |
| Thickness: | 200Å |
| [a-Si:H layer 1104] | |
| Gas flow rate ratio: | SiH$_4$/H$_2$ = 0.2 |
| Substrate temperature: | 250° C. |
| Vacuum degree: | 1.0 Torr |
| RF power: | 20 W |
| Thickness: | 5000Å |
| [(p+) a-Si:O:H layer 1105] | |
| III group dopant: | B$_2$H$_6$/H$_2$ 2000 ppm |
| Gas flow rate ratio: | SiH$_4$/H$_2$ = 0.2 |
| | CO$_2$/SiH$_4$ = 4 |
| | B$_2$H$_6$/SiH$_4$ = 1.0 × 10$^{-2}$ |
| Substrate temperature: | 250° C. |
| Vacuum degree: | 1.0 Torr |
| RF power: | 8 W |
| Thickness: | 500Å |

Finally, an ITO layer 1106 was formed with a thickness of 750Å on the (p+) a-Si:O:H layer 1105 by the RF sputtering method, whereby the amorphous silicon photosensor No. 7 according to the present invention was prepared.

EXAMPLE 8

Figure 12:
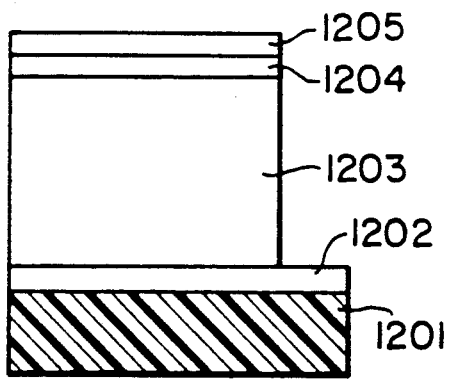

FIG. 12 shows a schematic cross sectional view of an amorphous silicon photosensor No. 8 according to the present invention, which was prepared as follows.

An ITO layer 1202 was formed with a thickness of 1,000Å on a Pyrex glass substrate 1201 by the DC magnetron sputtering method. A (p−) a-Si:H layer 1203 and an a-Si:O:H layer 1204 were successively formed on the ITO layer 1102 by the P-CVD method under the following layer formation conditions:

| [(p−) a-Si:H layer 1203] | |
| --- | --- |
| III group dopant: | B$_2$H$_6$/H$_2$ 2000 ppm |
| Gas flow rate ratio: | SiH$_4$/H$_2$ = 0.1 |
| | B$_2$H$_6$/SiH$_4$ = 3 × 10$^{-7}$ |
| Substrate temperature: | 250° C. |
| Vacuum degree: | 1.0 Torr |
| RF power: | 20 W |
| Thickness: | 6000Å |
| [a-Si:O:H layer 1204] | |
| Gas flow rate ratio: | SiH$_4$/H$_2$ = 0.1 |
| | CO$_2$/SiH$_4$ = 8 |
| Substrate temperature: | 250° C. |
| Vacuum degree: | 1.0 Torr |
| RF power: | 8 W |
| Thickness: | 250Å |

Finally, a SnO$_2$(Sb) layer 1205 was formed with a thickness of 500Å on the a-Si:O:H layer 1204 by the DC magnetron sputtering method, whereby the amorphous silicon photosensor No. 8 according to the present invention was prepared.

EXAMPLE 9

Figure 13:
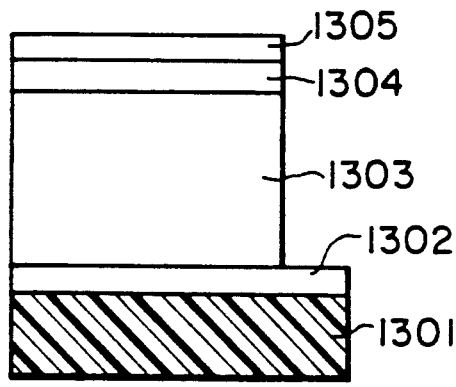

FIG. 13 shows a schematic cross sectional view of an amorphous silicon photosensor No. 9 according to the present invention, which was prepared as follows.

An ITO layer 1302 was formed with a thickness of 750Å on an ordinary glass substrate 1301 by the FR sputtering method. An a-Si:H layer 1303 and an a-Si:N:H layer 1304 were sucessively formed on the ITO layer 1302 by the P-CVD method under the following layer formation conditions:

| [a-Si:H layer 1303] | |
| --- | --- |
| Gas flow rate ratio: | SiH$_4$/H$_2$ = 0.2 |
| Substrate temperature: | 250° C. |
| Vacuum degree: | 1.0 Torr |
| RF power: | 20 W |
| Thickness: | 6000Å |
| [a-Si:N:H layer 1304] | |
| Gas flow rate ratio: | SiH$_4$/H$_2$ = 0.2 |
| | NH$_3$/SiH$_4$ = 10 |
| Substrate temperature: | 250° C. |
| Vacuum degree: | 1.0 Torr |
| RF power: | 10 W |
| Thickness: | 200Å |

Finally a TiO$_2$ layer 1305 was formed with a thickness of 500Å on the a-Si:N:H layer 1304 by the P-CVD method, whereby the amorphous silicon photosensor No. 9 according to the present invention was prepared.

EXAMPLE 10

Figure 14:
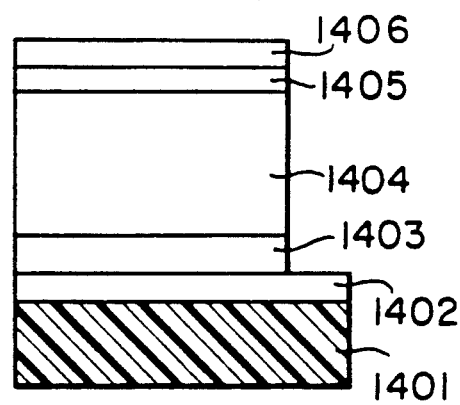

FIG. 14 shows a schematic cross sectional view of an amorphous silicon photosensor No. 10 according to the present invention, which was prepared as follows.

A SnN layer 1402 was formed with a thickness of 1,000Å on a quarz substrate 1401 by the thermal CVD method. An a-Si:N:H layer 1403, a (p−) a-Si:H layer 1404, and an a-Si:N:H layer 1405 were successively formed on the SnN layer 1402 by the P-CVD method under the following layer formation conditions:

| [a-Si:N:H layer 1403] | |
| --- | --- |
| Gas flow rate ratio: | SiH$_4$/H$_2$ = 0.2 |
| | NH$_3$/SiH$_4$ = 4 |
| Substrate temperature: | 250° C. |
| Vacuum degree: | 1.0 Torr |
| RF power: | 10 W |
| Thickness: | 250Å |
| [(p−) a-Si:H layer 1404] | |
| III group dopant: | B$_2$H$_6$/H$_2$ 1.0 ppm |
| Gas flow rate ratio: | SiH$_4$/H$_2$ = 0.2 |
| | B$_2$H$_6$/SiH$_4$ = 5 × 10$^{-7}$ |
| Substrate temperature: | 250° C. |
| Vacuum degree: | 1.0 Torr |
| RF power: | 20 W |
| Thickness: | 8000Å |
| [a-Si:N:H layer 1405] | |
| Gas flow rate ratio: | SiH$_4$/H$_2$ = 0.2 |
| | NH$_3$/SiH$_4$ = 10 |
| Substrate temperature: | 250° C. |
| Vacuum degree: | 1.0 Torr |
| RF power: | 8 W |
| Thickness: | 150Å |

Finally, an ITO layer 1406 was formed with a thickness of 500Å on the a-Si:N:H layer 1405 by the RF sputtering method, whereby the amorphous silicon photosensor No. 10 according to the present invention was prepared.

EXAMPLE 11

Figure 15:
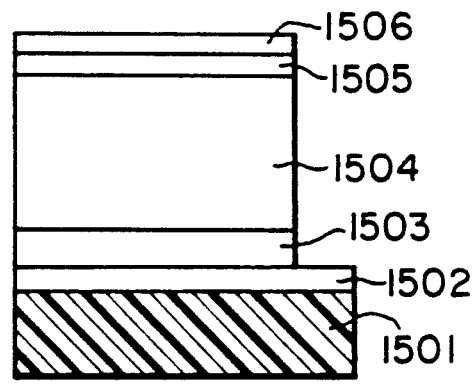

FIG. 15 shows a schematic cross sectional view of an amorphous silicon photosensor No. 11 according to the present invention, which was prepared as follows.

A BN layer 1502 was formed with a thickness of 750Å on a Pyrex substrate 1501 by the P-CVD method. A (p+) a-Si:N:H layer 1503, an a-Si:H layer 1504, and a-Si:N:H layer 1505 were successively formed on the BN layer 1502 by the P-CVD method under the following layer formation conditions:

| [(p+) a-Si:N:H layer 1503] | |
|---|---|
| III group dopant: | $B_2H_6/H_2$ 2000 ppm |
| Gas flow rate ratio: | $SiH_4/H_2 = 0.2$ |
| | $NH_3/SiH_4 = 6$ |
| | $B_2H_6/SiH_4 = 1.0 \times 10^{-2}$ |
| Substrate temperature | 250° C. |
| Vacuum degree: | 1.0 Torr |
| RF power: | 8 W |
| Thickness: | 500Å |
| [a-Si:H layer 1504] | |
| Gas flow rate ratio: | $SiH_4/H_2 = 0.2$ |
| Substrate temperature: | 250° C. |
| Vacuum degree: | 1.0 Torr |
| RF power: | 20 W |
| Thickness: | 5000Å |
| [a-Si:N:H layer 1505] | |
| Gas flow rate ratio: | $SiH_4/H_2 = 0.2$ |
| | $NH_3/SiH_4 = 10$ |
| Substrate temperature: | 250° C. |
| Vacuum degree: | 1.0 Torr |
| RF power: | 8 W |
| Thickness: | 200Å |

Finally, an ITO layer 1506 was formed with a thickness of 750 Å on the a-Si:N:H layer 1505 by the RF sputtering method, whereby the amorphous silicon photosensor No. 11 according to the present invention was prepared.

EXAMPLE 12

Figure 16:
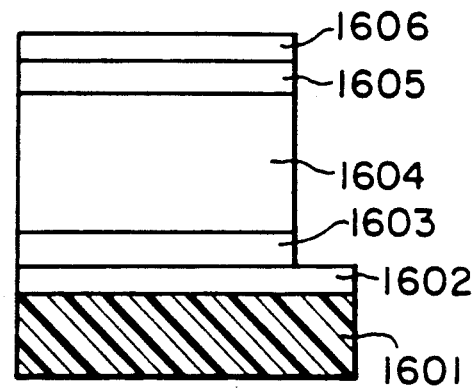

FIG. 16 shows a schematic cross sectional view of an amorphous silicon photosensor No. 12 according to the present invention, which was prepared as follows.

A $SnO_2$ layer 1602 was formed with a thickness of 1000 Å on a Pyrex substrate 1601 by the vacuum deposition method. A (p+) a-Si:N:H layer 1603, an a-Si:H layer 1604, and an (n+) a-Si:N:H layer 1605 were successively formed on the $SnO_2$ layer 1602 by the P-CVD method under the following layer formation conditions:

| [(p+) a-Si:N:H layer 1603] | |
|---|---|
| III group dopant: | $B_2H_6/H_2$ 2000 ppm |
| Gas flow rate ratio: | $SiH_4/H_2 = 0.2$ |
| | $NH_3/SiH_4 = 6$ |
| | $B_2H_6/SiH_4 = 1 \times 10^{-3}$ |
| Substrate Temperature: | 250° C. |
| Vacuum degree: | 1.0 Torr |
| RF power: | 8 W |
| Thickness: | 500Å |
| [a-Si:H layer 1604] | |
| Gas flow rate ratio: | $SiH_4/H_2 = 0.2$ |
| Substrate temperature: | 250° C. |
| Vacuum degree: | 1.0 Torr |
| RF power: | 20 W |
| Thickness: | 7000Å |
| [(n−) a-Si:N:H layer 1605] | |
| V group dopant: | $PH_3/H_2$ 2000 ppm |
| Gas flow rate ratio: | $SiH_4/H_2 = 0.2$ |
| | $NH_3/SiH_4 = 10$ |
| | $PH_3/SiH_4 = 3 \times 10^{-2}$ |
| Substrate temperature: | 250° C. |
| Vacuum degree: | 1.0 Torr |
| RF power: | 8 W |
| Thickness: | 200Å |

Finally, an ITO layer 1606 was formed with a thickness of 500 Å on the (n+) a-Si:N:H layer 1605 by the RF sputtering method, whereby the amorphous silicon photosensor No. 12 according to the present invention was prepared.

The amorphous silicon photosensors No. 1 through No. 12 according to the present invention were evaluated with respect to the photo-sensitivity and photo-response thereof.

The photo-sensitivity was assessed from the ratio (Iph/Id) of (i) the light-current, Iph, which was measured with application of a reverse bias voltage of 5 V and under illumination of each photosensor with the light of 16 $\mu W/cm^2$ by using an LED having a wavelength peak at 567 nm to (ii) the dark-current in the dark, Id.

Figure 17:
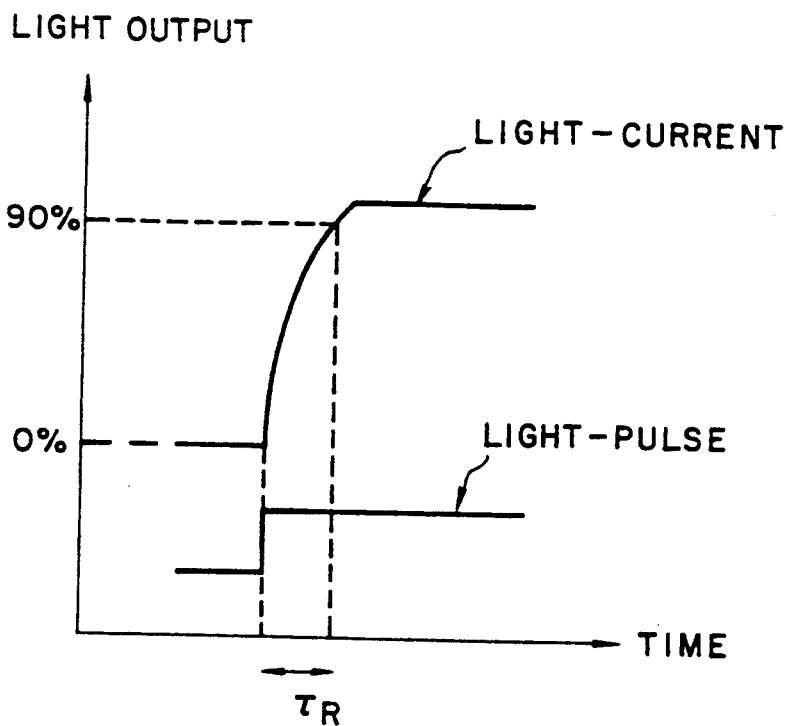
FIG. 17 is a diagram in explanation of the definition of a photo-responsive rising time R.

The photo-response was assessed by measuring the photo-response rate of each photosensor by illuminating each photosensor with a pulse light beam emitted from the above LED under application of a reverse bias voltage of 5 V. The photo-response rate is represented by the rising time ($\tau_R$) which is defined by the time required for the light-current thereof to reach 90% of the saturated value thereof after application of the light pulse as schematically shown in FIG. 17.

The results of the measurement of the photosensitivity and photo-response of the amorphous silicon photosensors No. 1 through No. 12 according to the present invention are as shown in Table 2.

TABLE 2

| Photo-sensors | Photo-sensitivity Iph/Id ratio | Photo-response $\tau_R$ (msec) |
|---|---|---|
| No. 1 | $4.0 \times 10^2$ | 1.25 |
| No. 2 | $1.0 \times 10^2$ | 0.10 |
| No. 3 | $2.5 \times 10^4$ | 0.10 |
| No. 4 | $4.5 \times 10^3$ | 0.15 |
| No. 5 | $1.0 \times 10^4$ | 0.05 |
| No. 6 | $1.5 \times 10^4$ | 0.05 |
| No. 7 | $2.0 \times 10^4$ | 1.25 |
| No. 8 | $1.0 \times 10^2$ | 1.25 |
| No. 9 | $3.5 \times 10^2$ | 1.45 |
| No. 10 | $1.0 \times 10^4$ | 2.50 |
| No. 11 | $6.0 \times 10^3$ | 0.30 |
| No. 12 | $1.0 \times 10^4$ | 0.45 |

Figure 18:
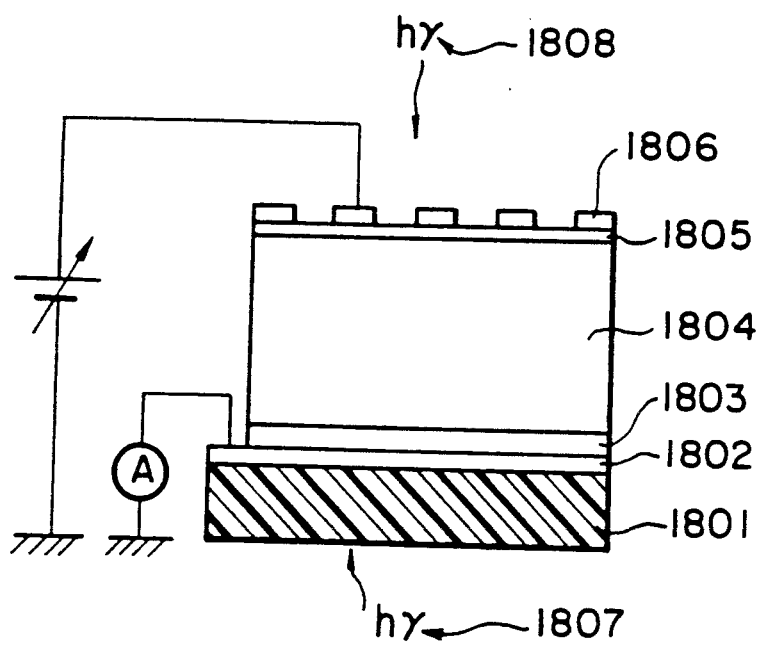
FIG. 18 is a diagram in explanation of an apparatus for measuring the light-current, dark-current and voltage characteristics of an amorphous silicon photosensor .No. 3-1 according to the present invention, which was prepared in the same manner as in Example 3.
Figure 19A:
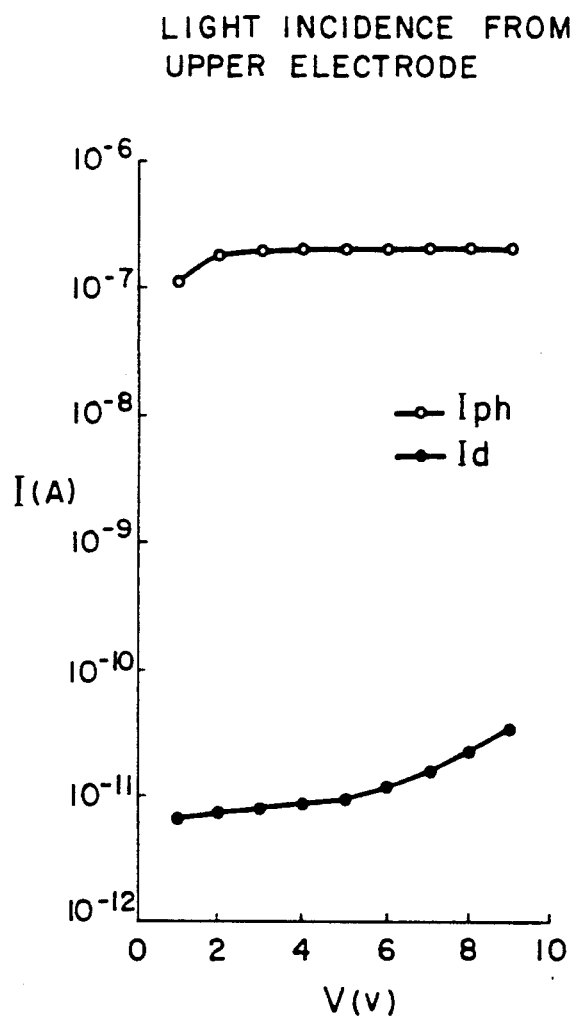
FIG. 19A is a graph showing the light-current, dark-current and voltage characteristics of the amorphous silicon photosensor No. 3-1 according to the present invention when light enters the upper electrode thereof.
Figure 19B:
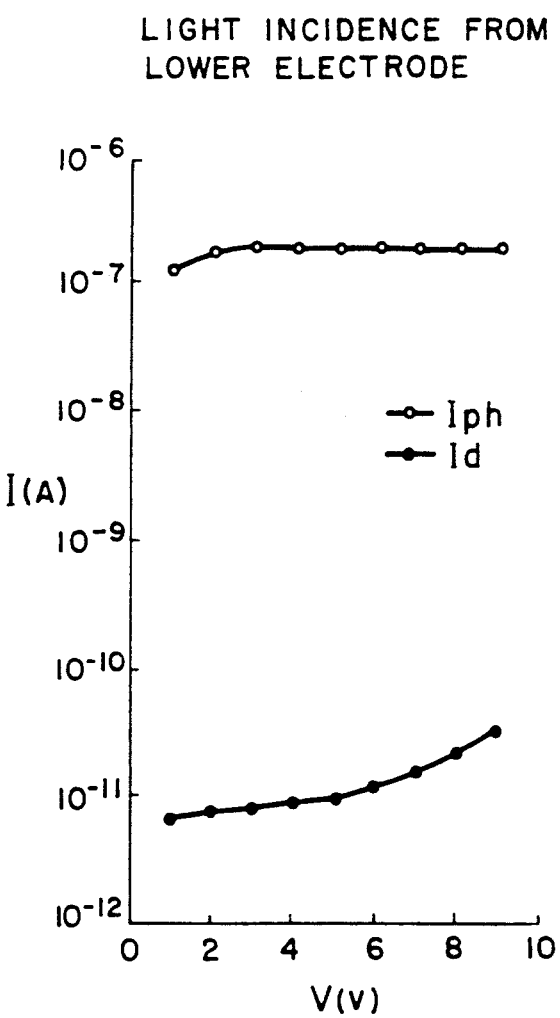
FIG. 19B is a graph showing the photoelectric and dark electric current - voltage characteristics of the amorphous silicon photosensor in Example 3 when light enters the lower electrode thereof.

FIG. 19 shows the light-current, dark-current and voltage characteristics of an amorphous silicon photosensor No. 3-1 according to the present invention, which is one of the most preferable examples of the amorphous silicon photosensors of the present invention. For the measurement of the above characteristics, the amorphous silicon photosensor No. 3-1 was prepared in the same manner as in Example 3, provided that an upper electrode 1806 was made of ITO in the form of a 1.6 mm dia. dots as shown in FIG. 18, and a reverse bias voltage was applied by changing the same to 1 to 9 V for measuring the light-current and dark-current were measured.

In FIG. 18, reference numeral 1801 indicates a substrate; reference numeral 1802, a lower electrode; reference numeral 1803, a first amorphous silicon layer; reference numeral 1804, a second amorphous silicon layer; reference numeral 1805, a third amorphous silicon layer; and reference numeral 1806, the above-mentioned upper electrode. In the above-mentioned measurement, an LED having a peak light wavelength at 567 nm was employed, and the amorphous silicon photosensor No. 3-1 was illuminated with the light of 16 $\mu$W/cm$^2$. The above measurement was carried out with the incident light directed in the direction of an upper electrode side 1808 and in the direction of the lower electrode side 1807.

As shown in FIG. 19, the amorphous photosensor No. 3 according to the present invention exhibited the same excellent light-current, dark-current and voltage characteristics in either direction of the incident light. From this point of view, the present invention provides photosensors capable of photosensing at the opposite duplex sides thereof.

By use of the above prepared amorphous photosensor No. 3 according to the present invention, a line photosensor was prepared with an 8 bit/mm, including 1728 of the photosensors to form an A-4 size line photosensor.

The light-current, Iph, and the dark-current, Id, which were statistically measured with application of a reverse bias voltage of 5 V under illumination of the photosensor with the light of 16 $\mu$W/cm$^2$ by using an LED having a wavelength peak at 567 nm. The result was that Iph was $8.0 \times 10^{-10}$ A, and Id was $6.0 \times 10^{-13}$ A, so that Iph/Id was $1.3 \times 10^3$.

As a dynamic characteristic of the photosensor, the S/N ratio of the photosensor was also measured by use of a drive circuit (not shown). The result was that the S/N ratio at 5 msec/line was 40 dB, and the S/N ratio at 1 msec/line was 25 dB.

Figure 20:
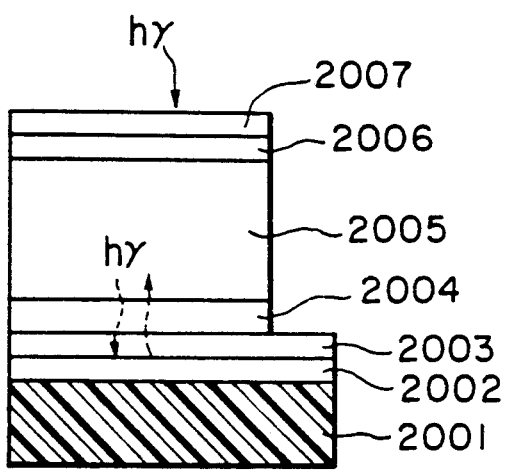
FIG. 20 is a schematic cross-sectional view of an example of an amorphous photosensor in Example 13 according to the present invention.

An amorphous photosensor which is capable of performing photosensing at the opposite duplex sides thereof will now be explained in more specifically. In the case where light is caused to enter to one side of a very thin photoelectric conversion layer of the amorphous photosensor, part of the incident light is passed through the photoelectric conversion layer and is not used for generation of the light-current in the photoelectric conversion layer, so that the obtained light-current is smaller than the light-current generated when the entire incident light is used in the photoelectric conversion layer. For this reason, it is preferable that the a-Si:H layers in the previously explained photosensors have a thickness of 5,000 Å or more However, in the case of the amorphous photosensor capable of performing duplex photosensing, for instance, with a structure including an aluminum layer with a reflectance of 90% or more as illustrated in FIG. 20, the light transmitted through the photoelectric conversion layer can be transmitted back again to the photoelectric conversion layer, so that the incident light can be totally used, thereby avoiding the decrease in the light-current. Therefore, in the case of the duplex photosensor, the a-Si:H layer may be as thin as 2,000 Å to 5,000 Å for use in practice.

A specific example of such a duplex photosensor will now be explained with reference to FIG. 20.

EXAMPLE 13

An aluminum reflection layer 2002 was formed with a thickness of 1,500 Å on a Pyrex substrate 1601 by the vacuum deposition method. An ITO layer 2003 serving as a lower electrode was then formed with a thickness of 500 Å on the aluminum reflection layer 2002 by the RF sputtering method. Subsequently an a-Si:O:H layer 2004 with a thickness of 750 Å, an a-Si:H layer 2005 with a thickness of 3,000 Å, and a (p+) a-Si:O:H 2006 with a thickness of 750 Å were successively formed on the ITO layer 2003 by the P-CVD method. Finally, an ITO layer 2007 with a thickness of 500 Å was formed on the (p+) a-Si:O:H layer by the RF sputtering method, whereby an amorphous photosensor No. 13 according to the present invention was prepared.

The thus prepared amorphous photosensor No. 13 was evaluated with respect to the light-current, dark-current and voltage characteristics. The result was that the Iph/Id ratio was $1.0 \times 10^4$, which indicates that even if the photoelectric conversion layer is very thin, such excellent photosensitivity can be obtained in this duplex photosensor.

Generally, in such duplex amorphous photosensors according to the present invention, the photoelectric conversion layer can be reduced to about 1/6 of the thickness of the photoelectric conversion layer of the one-side duplex amorphous photosensors.

What is claimed is:

1. An amorphous silicon photosensor, comprising a substrate, a lower electrode formed on said substrate, an amorphous silicon photoelectric conversion layer formed on said lower electrode, and an upper electrode formed on said amorphous silicon photoelectric conversion layer, wherein said substrate is transparent to incident light for photosensing, said lower electrode and said upper electrode each independently comprises at least one of an electroconductive oxide and an electroconductive nitride, both of said electrodes for receiving the incident light for photosensing being transparent to said incident light, and wherein said amorphous silicon photoelectric conversion layer comprises a plurality of amorphous silicon layers at least one of which is a hydrogenated amorphous silicon layer comprising at least one of oxygen atom and nitrogen atom, and further wherein at least one of said amorphous silicon layers in contact with at least one of said electroconductive oxide and electroconductive nitride, comprises at least one of the same atoms as constituent atoms of said electroconductive oxide and electroconductive nitride, and further wherein said amorphous photoelectric conversion layer comprises an a-Si:H layer and a pair of a-Si:O:H layers, with said a-Si:H layer being interposed between said pair of a-Si:O:H layers.

2. The amorphous silicon photosensor as claimed in claim 1, wherein at least one of said amorphous silicon layers of said amorphous silicon photoelectric conversion layer in contact with at least one of said electroconductive oxide and said electroconductive nitride comprises at least an atom selected from the group consisting of third (III) group atoms and fifth (V) group atoms in the periodic table.

3. The photoelectric conversion layer photosensor as claimed in claim 1, wherein said electroconductive oxide is selected from the group consisting of ITO, TiO$_2$, In$_2$O$_3$, SnO$_2$ and CrO$_2$.

4. The amorphous silicon photosensor as claimed in claim 3, wherein said electroconductive oxide is selected from the group consisting of ITO and In$_2$O$_3$.

5. The amorphous silicon photosensor as claimed in claim 1, wherein said electroconductive nitride is selected from the group consisting of InN, SnN, TiN and Bn.

6. The amorphous silicon photosensor as claimed in claim 5, wherein said electroconductive nitride is selected from the group consisting of InN and Bn.

7. The amorphous silicon photosensor as claimed in claim 1, wherein said hydrogenated amorphous silicon layer is an A-Si:H layer.

8. The amorphous silicon photosensor as claimed in claim 1, wherein said hydrogenated amorphous silicon layer is an a-Si:N:H layer.

9. The amorphous silicon photosensor as claimed in claim 1, wherein said hydrogenated amorphous silicon layer is an α-Si:O:H layer.

10. The amorphous silicon photosensor as claimed in claim 1, wherein said amorphous silicon photoelectric conversion layer comprises an a-Si:H layer and an a-Si:O:H layer.

11. The amorphous silicon photosensor as claimed in claim 1, wherein said amorphous silicon photoelectric conversion layer comprises an a-Si:H layer and an a-Si:O:H layer.

12. An amorphous silicon photosensor, comprising a substrate, a lower electrode formed on said substrate, an amorphous silicon photoelectric conversion layer formed on said lower layer electrode, and an upper electrode formed on said amorphous silicon photoelectric conversion layer, wherein said substrate is transparent to incident light for photosensing, said lower electrode and said upper electrode each independently comprises at least one of an electroconductive oxide and an electroconductive nitride, both of said electrodes for receiving the incident light for photosensing being transparent to said incident light, and wherein said amorphous silicon photoelectric conversion layer comprises a plurality of amorphous silicon layers at least one which is a hydrogenated amorphous silicon layer comprising at least one of oxygen atom and nitrogen atom, and further wherein at least one of said amorphous silicon layers in contact with at least one of said electroconductive oxide and electroconductive nitride, comprises at least one of the same atoms as constituent atoms of said electroconductive and electroconductive nitride, and further wherein said amorphous silicon photoelectric conversion layer comprises an a-Si:H layer and a pair of a-Si:N:H layers, with said a-Si:H layer being interposed between said pair of a-Si:N:H layers.

13. The amorphous silicon photosensor as claimed in claim 12, wherein at least one of said amorphous silicon layers of said amorphous silicon photoelectric conversion layer in contact with at least one of said electroconductive oxide and said electroconductive nitride comprises at least an atom selected from the group consisting of third (III) group atoms and fifth (V) group atoms in the periodic table.

14. The photoelectric conversion layer photosensor as claimed in claim 12, wherein said electroconductive oxide is selected from the group consisting of ITO, $TiO_2$, $In_2O_3$, $SnO_2$ and $CrO_2$.

15. The amorphous silicon photosensor as claimed in claim 14, wherein said electroconductive oxide is selected from the group consisting of ITO and $In_2O_3$.

16. The amorphous silicon photosensor as claimed in claims 12, wherein said electroconductive nitride is selected from the group consisting of InN, SnN, TiN and Bn.

17. The amorphous silicon photosensor as claimed in claim 16, wherein said electroconductive nitride is selected from the group consisting of InN and Bn.

18. The amorphous silicon photosensor as claimed in claim 12, wherein said hydrogenated amorphous silicon layer is an A-Si:H layer.

19. The amorphous silicon photosensor as claimed in claim 12, wherein said hydrogenated amorphous silicon layer is an a-Si:N:H layer.

20. The amorphous silicon photosensor as claimed in claim 12, wherein said hydrogenated amorphous silicon layer is an α-Si:O:H layer.

21. The amorphous silicon photosensor as claimed in claim 12, wherein said amorphous silicon photoelectric conversion layer comprises an a-Si:H layer and an a-Si:O:H layer.

22. The amorphous silicon photosensor as claimed in claim 12, wherein said amorphous silicon photoelectric conversion layer comprises an a-Si:H layer and an a-Si:O:H layer.

23. An amorphous silicon photosensor, comprising a substrate, a lower electrode formed on said substrate, an amorphous silicon photoelectric conversion layer formed on said lower electrode, and an upper electrode formed on said amorphous silicon photoelectric conversion layer, wherein said substrate is transparent to incident light for photosensing, said lower electrode and said upper electrode each independently comprises at least one of an electrode conductive oxide and an electroconductive nitride, both of said electrodes for receiving the incident light for photosensing being transparent to said incident light, and wherein said amorphous silicon photoelectric conversion layer comprises a plurality of amorphous silicon layers at least one of which is a hydrogenated amorphous silicon layer comprising at least one of oxygen atom and nitrogen atom, and further wherein at least one of said amorphous silicon layers in contact with at least one of said electroconductive oxide and electroconductive nitride, comprises at least one of the same atoms as constituent atoms of said electroconductive oxide and electroconductive nitride, and further wherein said amorphous silicon photoelectric conversion layer comprises an a-Si:H layer, and a-Si:N:H layer and an a-Si:O:H layer, with said a-Si:H layer being interposed between said a-Si:N:H layer and said a-Si:O:H layer.

24. The amorphous silicon photosensor as claimed in claim 23, wherein at least one of said amorphous silicon layers of said amorphous silicon photoelectric conversion layer in contact with at least one of said electroconductive oxide and said electroconductive nitride comprises at least an atom selected from the group consisting of third (III) group atoms and fifth (V) group atoms in the periodic table.

25. The photoelectric conversion layer photosensor as claimed in claim 23, wherein said electroconductive oxide is selected from the group consisting of ITO, $TiO_2$, $In_2O_3$, $SnO_2$ and $CrO_2$.

26. The amorphous silicon photosensor as claimed in claim 25, wherein said electroconductive oxide is selected from the group consisting of ITO and $In_2O_3$.

27. The amorphous silicon photosensor as claimed in claims 23, wherein said electroconductive nitride is selected from the group consisting of InN, SnN, TiN and Bn.

28. The amorphous silicon photosensor as claimed in claim 27, wherein said electroconductive nitride is selected from the group consisting of InN and Bn.

29. The amorphous silicon photosensor as claimed in claim 23, wherein said hydrogenated amorphous silicon layer is an A-Si:H layer.

30. The amorphous silicon photosensor as claimed in claim 23, wherein said hydrogenated amorphous silicon layer is an a-Si:N:H layer.

31. The amorphous silicon photosensor as claimed in claim 23, wherein said hydrogenated amorphous silicon layer is an α-Si:O:H layer.

32. The amorphous silicon photosensor as claimed in claim 23, wherein said amorphous silicon photoelectric conversion layer comprises an a-Si:H layer and an a-Si:O:H layer.

33. The amorphous silicon photosensor as claimed in claim 23, wherein said amorphous silicon photoelectric conversion layer comprises an a-Si:H layer and an a-Si:O:H layer.

* * * * *